(12) United States Patent
Niccum et al.

(10) Patent No.: US 11,699,865 B2
(45) Date of Patent: Jul. 11, 2023

(54) REMOVABLE ELECTRICAL CONNECTORS AND DEVICES

(71) Applicant: 3M INNOVATIVE PROPERTIES COMPANY, St. Paul, MN (US)

(72) Inventors: Kayla C. Niccum, Maplewood, MN (US); Ankit Mahajan, Cupertino, CA (US); Mikhail L. Pekurovsky, Bloomington, MN (US); Nicholas T. Gabriel, Grand Rapids, MN (US); Roger W. Barton, Afton, MN (US); Kara A. Meyers, Oakdale, MN (US); Saagar A. Shah, Minneapolis, MN (US); Jonathan W. Kemling, Woodbury, MN (US); Richard C. Webb, St. Paul, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 94 days.

(21) Appl. No.: 17/594,688

(22) PCT Filed: May 1, 2020

(86) PCT No.: PCT/IB2020/054155
§ 371 (c)(1),
(2) Date: Oct. 26, 2021

(87) PCT Pub. No.: WO2020/229934
PCT Pub. Date: Nov. 19, 2020

(65) Prior Publication Data
US 2022/0209436 A1    Jun. 30, 2022

Related U.S. Application Data

(60) Provisional application No. 62/846,120, filed on May 10, 2019.

(51) Int. Cl.
*H01R 4/00* (2006.01)
*H01R 4/58* (2006.01)
(Continued)

(52) U.S. Cl.
CPC ............... *H01R 4/58* (2013.01); *H01R 12/61* (2013.01); *H01R 12/62* (2013.01); *H01R 43/00* (2013.01);
(Continued)

(58) Field of Classification Search
CPC .......... H01R 4/58; H01R 12/61; H01R 12/62; H01R 43/00; H05K 3/365; H05K 2203/176
See application file for complete search history.

(56) References Cited

U.S. PATENT DOCUMENTS 4,024,312 A   5/1977  Korpman
5,516,581 A   5/1996  Kreckel
(Continued)

FOREIGN PATENT DOCUMENTS

DE        3331016       10/1984

OTHER PUBLICATIONS

International Search Report for PCT International Application No. PCT/IB2020/054155, dated Jul. 31, 2020, 3 pages.

*Primary Examiner* — Phuong Chi Thi Nguyen
(74) *Attorney, Agent, or Firm* — Thomas M. Spielbauer

(57) ABSTRACT

Flexible electrical connectors are provided to electrically connect electronic devices. The flexible electrical connector includes a removable adhesive tape strip having an adhesive surface thereof and an electrically conductive trace disposed on the adhesive tape strip. The flexible electrical connector engages an electronic device to form an electrical contact where the adhesive tape strip has an adhesive surface (Continued)

removably adhesively bonded to the substrate of the electronic device to at least partially cover the electrical contact.

18 Claims, 4 Drawing Sheets

(51) Int. Cl.
*H01R 12/61* (2011.01)
*H01R 12/62* (2011.01)
*H01R 43/00* (2006.01)
*H05K 3/36* (2006.01)

(52) U.S. Cl.
CPC ....... H05K 3/365 (2013.01); *H05K 2203/176* (2013.01)

(56) References Cited

U.S. PATENT DOCUMENTS

| | | | |
|---|---|---|---|
| 5,794,815 A * | 8/1998 | Carlson | B65H 1/00 221/45 |
| 6,004,642 A * | 12/1999 | Langford | C09J 7/20 428/308.8 |
| 6,106,937 A * | 8/2000 | Hamerski | A47G 1/175 248/467 |
| 6,117,531 A * | 9/2000 | Schacht | C09J 7/22 428/354 |
| 6,231,962 B1 | 5/2001 | Bries | |
| 6,245,177 B1 * | 6/2001 | Luhmann | A47G 1/175 156/247 |
| 6,403,206 B1 | 6/2002 | Bries | |
| 6,569,521 B1 * | 5/2003 | Sheridan | C09J 7/29 428/40.1 |
| 7,175,876 B2 * | 2/2007 | Free | H05K 3/0079 427/430.1 |
| 9,207,407 B2 * | 12/2015 | Barnette, Jr. | G02B 6/36 |
| 9,768,086 B2 | 9/2017 | Nuzzo | |
| 2003/0096531 A1 | 5/2003 | Taylor | |
| 2004/0077189 A1 | 4/2004 | St. John | |
| 2006/0292900 A1 | 12/2006 | Pabst | |
| 2011/0065319 A1 | 3/2011 | Oster | |
| 2012/0015126 A1 | 1/2012 | Tatsuzawa | |

* cited by examiner

REMOVABLE ELECTRICAL CONNECTORS AND DEVICES

CROSS REFERENCE TO RELATED APPLICATIONS

This application is a national stage filing under 35 U.S.C. 371 of PCT/IB2020/054155, filed May 1, 2020, which claims the benefit of U.S. Application No. 62/846,120, filed May 10, 2019, the disclosure of which is incorporated by reference in its/their entirety herein.

BACKGROUND

Electrical connectors are widely used to join electrical terminations or contacts and create electrical devices. For example, an integrated circuit (IC) socket or electrical connection may be formed by mechanical or friction-based contacts such as springs or clips. Zero insertion force (ZIF) is a type of integrated circuit (IC) socket or electrical connector that requires very little force for insertion. Commercially available electrical connectors usually create robust, hard and rigid connections.

SUMMARY

There is a desire to removably connect a flexible/rigid circuit to another flexible/rigid circuit. Removable electrical connectors and devices, and methods of making and using the same are provided. Briefly, in one aspect, a method of removably connecting electronic devices is provided. The method including providing a first electronic device comprising a first electrically conductive trace being at least partially disposed on an adhesive tape strip, the first electrically conductive trace having a first exposed contact surface; providing a second electronic device comprising a second electrically conductive trace disposed on a substrate thereof, the second electrically conductive trace having a receiving contact surface; and engaging the first and second electronic devices such that the first exposed contact surface of the first electrically conductive trace and the receiving contact surface of the second electrically conductive trace at least partially contact to each other to form an electrical contact, and the adhesive tape strip having an adhesive surface removably adhesively bonded to the substrate of the second electronic device to at least partially cover the electrical contact.

In another aspect, a flexible electrical connector is provided. The flexible electrical connector includes a removable adhesive tape strip including a flexible backing layer and an adhesive surface on the flexible backing layer; and one or more electrically conductive traces disposed on the adhesive tape strip. The adhesive tape strip extends between a first end and a second end thereof, the adhesive surface having an exposed portion adjacent to the first end, and the electrically conductive traces having an exposed electrical contact surface adjacent to the first end.

In another aspect, an electronic device assembly is provided. The assembly includes a flexible electrical connector. The flexible electrical connector includes a removable adhesive tape strip including a flexible backing layer and an adhesive surface on the flexible backing layer; and one or more electrically conductive traces disposed on the adhesive tape strip. The adhesive tape extends between a first end and a second end thereof, the adhesive surface having an exposed portion adjacent to the first end, and the electrically conductive traces having an exposed electrical contact surface adjacent to the first end. The assembly further includes a first electronic device including a receiving electrically conductive trace disposed on a substrate thereof, the receiving electrically conductive trace having a receiving contact surface. The exposed contact surface of the electrical connector and the receiving contact surface of the electrically conductive trace at least partially contact to each other to form an electrical contact, and the exposed portion of the adhesive surface is removably adhesively bonded to the substrate of the electronic device to at least partially cover the electrical contact.

Various unexpected results and advantages are obtained in exemplary embodiments of the disclosure. One such advantage of exemplary embodiments of the present disclosure is that a flexible electrical connector described herein can be removably and adhesively bonded to a substrate surface of another electronic device to cover, maintain and protect an electrical contact formed between the connector and the electronic device. In some embodiments, the connector can be stretching-releasable from the substrate surface, leaving the electronic device intact after the removal. The connector can also be used to removably connect multiple electronic devices.

Various aspects and advantages of exemplary embodiments of the disclosure have been summarized. The above Summary is not intended to describe each illustrated embodiment or every implementation of the present disclosure. The Drawings and the Detailed Description that follow more particularly exemplify certain preferred embodiments using the principles disclosed herein.

BRIEF DESCRIPTION OF THE DRAWINGS

The disclosure may be more completely understood in consideration of the following detailed description of various embodiments of the disclosure in connection with the accompanying figures, in which.

Figure 1A:
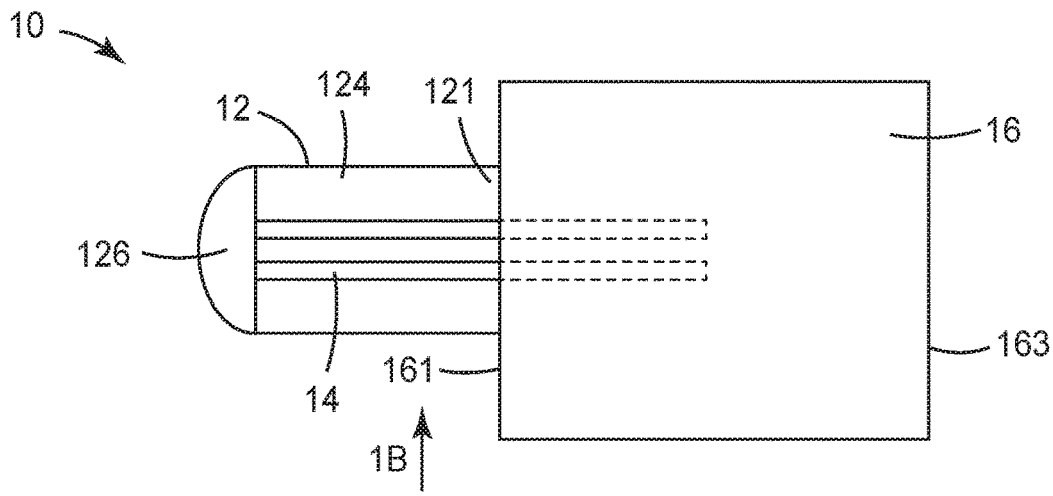
FIG. 1A is a top view of a flexible electrical connector, according to one embodiment.

In the drawings, like reference numerals indicate like elements. While the above-identified drawings, which may not be drawn to scale, set forth various embodiments of the present disclosure, other embodiments are also contemplated, as noted in the Detailed Description. In all cases, this disclosure describes the presently disclosed disclosure by way of representation of exemplary embodiments and not by express limitations. It should be understood that numerous other modifications and embodiments can be devised by those skilled in the art, which fall within the scope and spirit of this disclosure.

DETAILED DESCRIPTION

For the following Glossary of defined terms, these definitions shall be applied for the entire application, unless a different definition is provided in the claims or elsewhere in the specification.

Glossary

Certain terms are used throughout the description and the claims that, while for the most part are well known, may require some explanation. It should be understood that:

The term "stretch releasable" refers to a property of an extensible adhesive, tape, film, or other suitable structures. A stretch releasable structure has an adhesive surface configured to form an adhesive bond to a substrate and then be released therefrom upon stretching via a shearing mechanism. Typically, the stretch releasable structure may be cleanly removable from the substrate or substrates with little or no visible residue remaining on the substrate and no visible damage to the substrate.

The term "flexible" refers to a property, and materials having such a property typically lack rigidity or stiffness under ambient conditions or being capable of being formed into a roll. In some embodiments, the term "flexible" refers to being capable of being bent around a roll core with a radius of curvature of up to 7.6 centimeters (cm) (3 inches), in some embodiments up to 6.4 cm (2.5 inches), 5 cm (2 inches), 3.8 cm (1.5 inch), or 2.5 cm (1 inch). In some embodiments, a flexible assembly can be bent around a radius of curvature of at least 0.635 cm (¼ inch), 1.3 cm (½ inch) or 1.9 cm (¾ inch).

The term "rigid" refers to a property, and a material having such a property tends to maintain a given shape at ambient temperatures in the absence of excess heat or external forces exerted on the material. A rigid material may not be entirely inflexible. Some rigid materials may be bent or otherwise deformed when heated, handled or the like. It will be appreciated that the differences between a rigid material and a flexible material may be accounted for, in some instances, by the use of different materials, different structures, or by variations in the thickness of the same or similar material (e.g., increasing the thickness of a material can provide rigidity).

The term "disposable" refers to an electrical connector, an electronic device, or its component or combination, which is not intended to be recycled, restored or reused after a single use.

The term "non-disposable" refers to an electrical connector, an electronic device, or its component or combination, which is intended to be recycled, restored or reused after a single or multiple use.

The term "metal" refers to an opaque, fusible, ductile, and typically lustrous substance that is a good conductor of electricity and heat, forms a cation by loss of electron(s), and yields basic oxides and hydroxides.

The term "plastic" as used herein, refers to any one of rigid organic materials that are typically thermoplastic or thermosetting polymers of high molecular weight and that can be made into objects (e.g., layers or cores).

The terms "polymer" or "polymers" includes homopolymers and copolymers, as well as homopolymers or copolymers that may be formed in a miscible blend, e.g., by coextrusion or by reaction, including, e.g., transesterification. The term "copolymer" includes random, block and star (e.g. dendritic) copolymers.

As used in this specification and the appended embodiments, the singular forms "a", "an", and "the" include plural referents unless the content clearly dictates otherwise. Thus, for example, reference to layers containing "a metal" includes a mixture of two or more metals. As used in this specification and the appended embodiments, the term "or" is generally employed in its sense including "and/or" unless the content clearly dictates otherwise. As used in this specification, the recitation of numerical ranges by endpoints includes all numbers subsumed within that range (e.g. 1 to 5 includes 1, 1.5, 2, 2.75, 3, 3.8, 4, and 5).

Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

Various exemplary embodiments of the disclosure will now be described with particular reference to the Drawings. Exemplary embodiments of the present disclosure may take on various modifications and alterations without departing from the spirit and scope of the disclosure. Accordingly, it is to be understood that the embodiments of the present disclosure are not to be limited to the following described exemplary embodiments, but are to be controlled by the limitations set forth in the claims and any equivalents thereof.

Figure 1B:
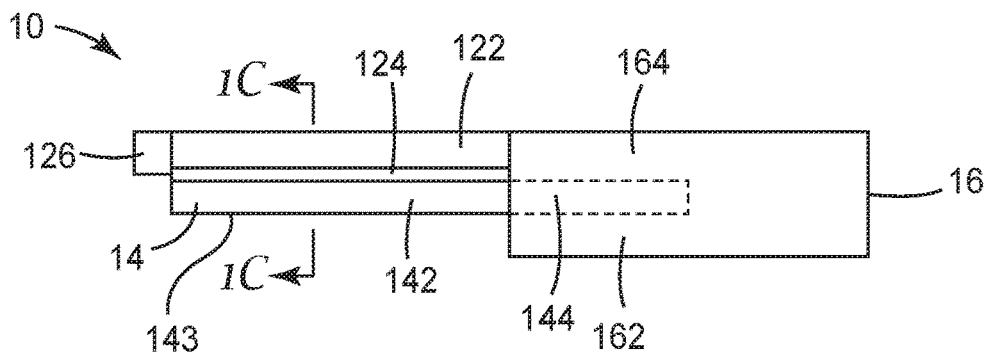
FIG. 1B is a side view of the flexible electrical connector of FIG. 1A.
Figure 1C:
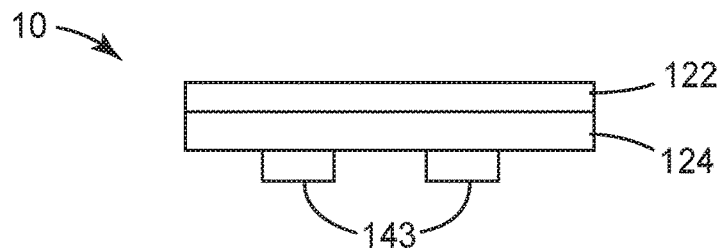
FIG. 1C is a cross-sectional view of the flexible electrical connector of FIG. 1B.

FIG. 1A is a top view of a flexible electrical connector 10, according to one embodiment of the present disclosure. FIGS. 1B-C are a side view and a cross-sectional view of the flexible electrical connector 10, respectively. The flexible electrical connector 10 includes an adhesive tape strip 12 having a flexible backing layer 122 and an adhesive surface 124 on the flexible backing layer 122. In the depicted embodiment of FIGS. 1A-C, the adhesive tape strip 12 has one end 121 attached to a side 161 of a substrate 16 of the flexible electrical connector 10. A non-adhesive pull tab 126 is provided at an end of the adhesive tape strip 12 opposite the end 121. It is to be understood that the adhesive tape strip 12 may have any suitable configurations, shapes or sizes for desired applications.

The flexible electrical connector 10 further includes one or more electrically conductive traces 14. In the depicted embodiment of FIGS. 1A-C, the electrically conductive traces 14 has a first portion 142 disposed on the adhesive tape strip 12 and a second portion 144 embedded in the substrate 16. The first portion 142 of the electrically conductive traces 14 has an exposed contact surface 143 configured to contact another exposed contact surface to form an electrical contact. The thicknesses of the layers of the Figures are not to scale with respect to one another. It is to be understood that a liner (not shown) can be provided to cover and protect the exposed surface of the adhesive surface 124 and/or the exposed contact surface 143 before use.

The electrically conductive traces 14 can include any suitable electrically conductive materials such as, for example, metal (e.g., copper, silver), metal alloy, etc. The electrically conductive traces 14 can be disposed on the flexible electrical connector 10 by any suitable processes such as, for example, printing, laminating, depositing, evaporating, etc. In the depicted embodiment of FIGS. 1A-C, the portion 142 of electrically conductive traces 14 are adhesively bonded to the adhesive surface 124. In some embodiments, the electrically conductive traces 14 can be adhesively bonded to an adhesive surface of a flexible backing and has a portion of the traces can be covered by a protective layer such as, for example, a liner.

The substrate 16 can be any flexible circuits. In some embodiments, the substrate 16 can include a thin insulating polymer film where conductive circuit patterns can be affixed thereto. A thin polymer coating can be provided to protect the conductive circuit patterns. In some embodiments, the adhesive tape strip 12 and the substrate 16 may form an integral adhesive tape structure and the electrically conductive traces on the substrate 16 can be covered by a liner. It is to be understood that the integral adhesive tape structure may include multiple adhesive tape strips 12 configured to removably connect to multiple electronic devices, respectively.

In some embodiments, the substrate 16 of the flexible electrical connector 10 may support a flexible circuitry thereon which is electrically connected to the electrically conductive traces 14. In some embodiments, one or more second adhesive tape strips may be provided to connect to a side 163 of the substrate 16 or other sides different from or the same as the side 161. The one or more second adhesive tape strips may have a configuration similar to the adhesive tape strip 12, with the respective electrically conductive traces formed thereon. The electrically conductive traces of the respective adhesive tape strips may be electrically connected as desired such that the flexible electrical connector 10 can be applied to electrically connect multiple electronic devices via the respective adhesive tape strips of the flexible electrical connector 10.

In some embodiments, the flexible electrical connector 10 can be made of one or more adhesive tape structures having one or more exposed adhesive surfaces (e.g., the adhesive surface 124) where one or more exposed contact surfaces (e.g., the contact surface 143) are provided to contact another exposed contact surface to form the respective electrical contacts. The adhesive tape structures can be formed in various configurations to electrically connect multiple electronic devices.

Figure 2A:
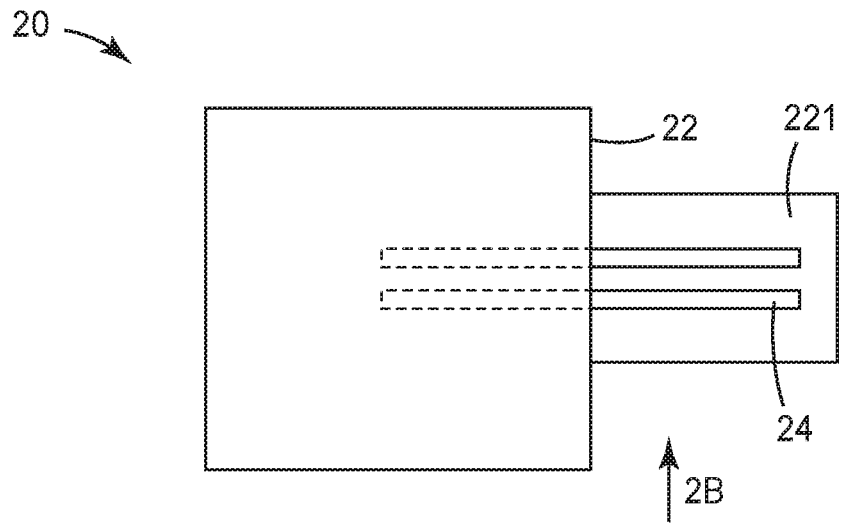
FIG. 2A is a top view of an electronic device, according to one embodiment.
Figure 2B:
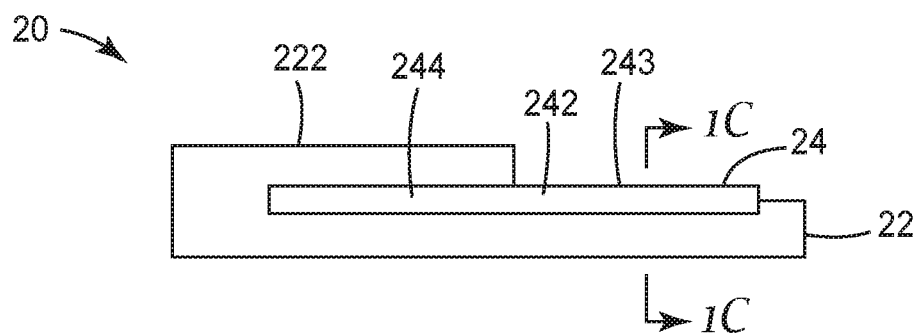
FIG. 2B is a side view of the electronic device of FIG. 2A.
Figure 2C:
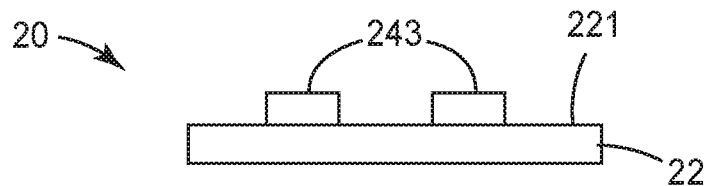
FIG. 2C is a cross-sectional view of the electronic device of FIG. 2B.

The flexible electrical connector 10 can be used to electrically connect various electronic devices. FIG. 2A is a top view of an exemplary electronic device 20, according to one embodiment. FIGS. 2B-C are a side view and cross-sectional view of the electronic device 10, respectively. The electronic device 20 can be a rigid or flexible circuit, which includes a substrate 22 and one or more electrically conductive traces 24 disposed on the substrate 22. In the depicted embodiment of FIGS. 2A-C, the electrically conductive traces 24 has a first portion 242 disposed on a substrate surface 221 and a second portion 244 embedded in a substrate body 222. The first portion 242 of the electrically conductive traces 24 has a contact surface 243 configured to contact the contact surface 143 of the electrical connector 10 to form an electrical contact. It is to be understood that the electronic device 20 can be any suitable rigid or flexible circuit having one or more electrically conductive traces or electrical contact pads disposed on a substrate surface thereof. The traces or pads can be electrically connected to one or more circuit components of the circuit. The circuit can be, for example, a single or multilayered board with IC components, resistors and capacitor chips, battery components, etc.

Figure 3A:
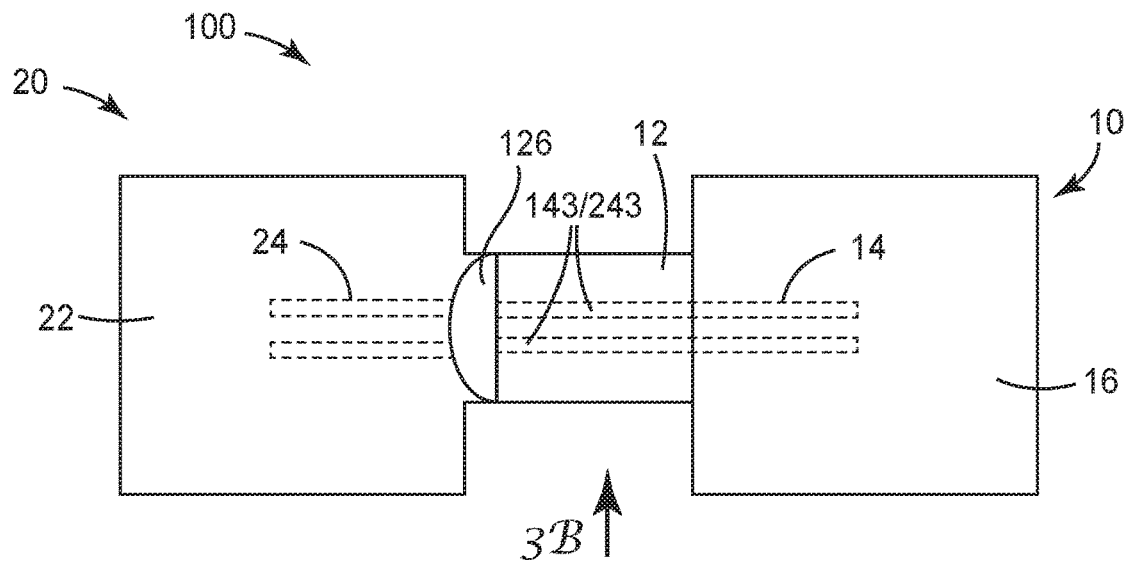
FIG. 3A is a top view of an electronic assembly where the flexible electrical connector of FIG. 1A is removably connected to the electronic device of FIG. 2A, according to one embodiment.
Figure 3B:
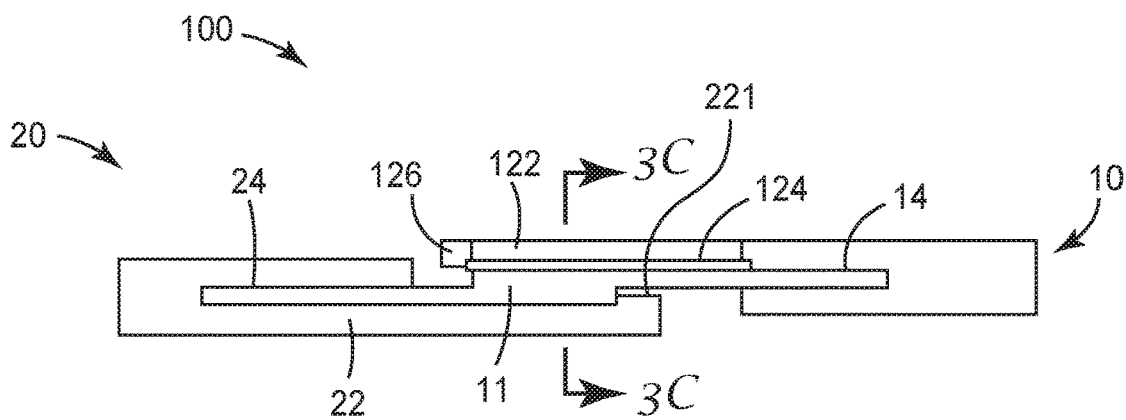
FIG. 3B is a side view of the electronic assembly of FIG. 3A.
Figure 3C:
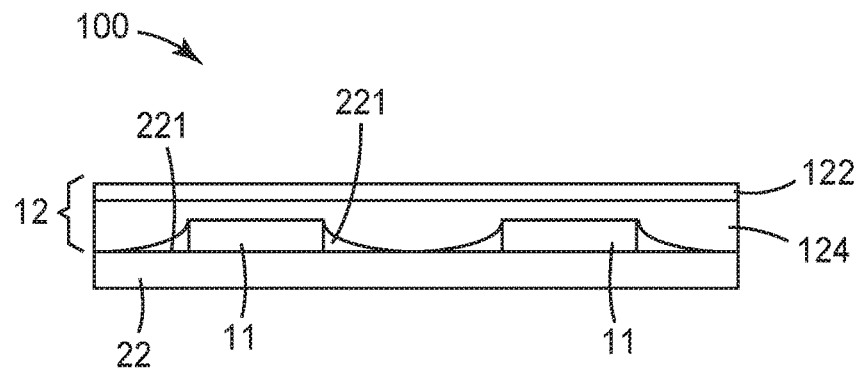
FIG. 3C is a cross-sectional view of the electronic assembly of FIG. 3B.

FIG. 3A is a top view of an electronic assembly 100 where the flexible electrical connector 10 of FIGS. 1A-C is removably connected to the electronic device 20 of FIGS. 2A-C, according to one embodiment. FIGS. 3B-C are a side view and a cross-sectional view of the electronic assembly 100, respectively. The flexible electrical connector 10 and the electronic device 20 are engaged such that the exposed contact surface 143 of the electrically conductive trace 14 of the flexible electrical connector 10 and the exposed contact surface 243 of the electrically conductive trace 24 of the electronic device 20 form an electrical contact 11. As shown in FIG. 3C, the adhesive tape strip 12 has its adhesive surface 124 removably adhesively bonded to the substrate surface 221 of the electronic device 20 to at least partially cover the electrical contact 11. A suitable pressure can be applied to press the adhesive tape strip 12 against the substrate surface 221 to form the adhesive bonding. It is to be understood that the respective traces 14 and 24 of the electrical connector 10 and the electronic device 20 can be aligned by any suitable processes when applying the pressure.

When the flexible electrical connector 10 is removably connected to the electronic device 20, the adhesive surface 124 of the flexible electrical connector 10 is adhesively bonded to the substrate surface 221 of the electronic device 20. On one hand, the adhesive bonding between the adhesive surface 124 and the substrate surface 221 may be strong enough to substantially maintain the mechanical and electrical properties of the electrical contact 11, for example, upon flexing. On the other hand, the adhesive surface 124 may include a releasable adhesive permitting removal of the adhesive tape strip 12 from the substrate surface 221 of the electronic device 20 while leaving little or no adhesive residue and no physical damage on the substrate surface 221 and the electrically conductive trace 24 thereon. In other words, the electronic device 20 can remain substantially intact after the removal of the adhesive tape strip 12 therefrom. It is to be understood that even after multiple bonding and de-bonding events of between the flexible electrical connector and a non-disposable electronic device, the non-disposable electronic device may still remain substantially intact, i.e., without any noticeable damage to its functional components.

In some embodiments, the substrate 22 of the electronic device 20 can made from, for example, a web of indefinite length material being conveyed through a web path in a roll-to-roll process. The flexible substrate may include, for example, polyethylene terephthalate (PET), polyethylene, polystyrene, polyurethane, etc. The processes of connecting the flexible electrical connector 10 to the electronic device 20 can be carried out by using one or more rollers to apply the pressure or by any other suitable processes. In some embodiments, the substrate 22 or a portion of the substrate 22 may be rigid, made of materials include, for example, bakelite, acrylonitrile butadiene styrene (ABS), cured epoxy systems, etc.

In some embodiments, the electronic device 20 can be a non-disposable electronic device such as, for example, a multi-component PCB board, a multi-component flex board, etc. The flexible electrical connector 10 can be a disposable electronic device that can be removably connected to one or more non-disposable electronic devices to provide electrical connections therebetween.

The flexible adhesive tape strip 12 of the flexible electrical connector 10 can be produced by any conventional method for preparing adhesive tapes. In one embodiment, the adhesive surface 124 can be prepared by directly coating an adhesive onto the flexible backing layer 122. In another embodiment, the adhesive surface 124 can be formed as a separate layer and then later laminated to the flexible backing layer 122. In some embodiments, two or more sub-layers can be co-extruded to provide the flexible backing layer 122. The flexible backing layer may have an overall thickness in the range, for example, from about 0.5 mm to about 50 mm, or from about 1.0 mm to about 25 mm.

In some embodiments, the adhesive tape strip 12 can be stretchable to accomplish removal. The adhesive surface 124 may include pressure-adhesive adhesive on one or both major surfaces thereof, and the flexible backing layer 122 may include a highly extensible material. In some embodiments, the adhesive tape strip 12 may include a solid adhesive material that itself provides one or two adhesive surfaces and is sufficiently extensible.

In some embodiments, the adhesive tape strip 12 may be a stretch releasable adhesive strip including any conventionally known stretch releasable adhesive such as, for example, (i) a pressure sensitive adhesive tape having an elastic backing, (ii) a pressure sensitive adhesive tape with a highly extensible and substantially inelastic backing, (iii) a solid, elastic pressure sensitive adhesive that itself provides one or two adhesive surfaces and is sufficiently extensible, etc.

Specific stretch releasable adhesive strips suitable for use in the various embodiments of the present disclosure may include, for example, the pressure sensitive adhesives (PSA) with elastic backings described in U.S. Pat. No. 4,024,312 (Korpman), the pressure sensitive adhesives with highly extensible and substantially inelastic backings described in U.S. Pat. No. 5,516,581 (Kreckel et al.) and U.S. Pat. No. 6,231,962 (Bries et al.), the solid, elastic pressure sensitive adhesive described in German Patent No. 33 31 016, which are incorporated herein by reference.

Representative examples of materials suitable for the flexible backing layer 122 can include, for example, polyolefins, such as polyethylene, including high density polyethylene, low density polyethylene, linear low density polyethylene, and linear ultra low density polyethylene, polypropylene, and polybutylenes; vinyl copolymers, such as polyvinyl chlorides, both plasticized and unplasticized, and polyvinyl acetates; olefinic copolymers, such as ethylene/methacrylate copolymers, ethylene/vinyl acetate copolymers, acrylonitrile-butadienestyrene copolymers, and ethylene/propylene copolymers; acrylic polymers and copolymers; polyurethanes; and combinations of the foregoing. Mixtures or blends of any plastic or plastic and elastomeric materials such as polypropylene/polyethylene, polyurethane/polyolefin, polyurethane/polycarbonate, polyurethane/polyester, can also be used.

In some embodiments, the flexible backing layer 122 can include a composite foam having a flexible polymeric foam layer, a first film laminated to a first major surface of the foam layer, and/or a second film laminated to a second, opposite major surface of the foam layer. Adhesive(s) can be attached to the film(s) to form a structure of one or two adhesive surfaces such as, for example, adhesive-film-foam or adhesive-film-foam-film-adhesive. The flexible polymeric foam layer can be chosen to optimize conformability and resiliency properties which are helpful when the adhesive tape strip 12 is to be adhered to surfaces having surface irregularities, for example, the substrate surface 221 with the electrically conductive traces 24 or other circuit components thereon.

In some embodiments, a flexible polymeric foam layer of the flexible backing layer 122 can include polyolefin foams which are available under the trade designations "Volextra" and "Volara" from Voltek, Division of Sekisui America Corporation, Lawrence, Mass.

The adhesive of a stretch releasable tape described herein can include any pressure-sensitive adhesive, with the particular adhesion properties being dependent on the use of the tape, with the adhesion properties generally ranging, for example, from about 4 N/dm to about 200 N/dm, or from about 25 N/dm to about 100 N/dm, at a peel angle of 180°, measured according to PSTC-1 and PSTC-3 and ASTM D903-83 at a peel rate of 12.7 cm/min. Adhesives having higher peel adhesion levels usually may require backings having higher tensile strength.

The thickness of each adhesive layer can range, for example, from about 0.6 mils to about 40 mils (about 0.015 to about 1.0 mm), or from about 1 mils to about 16 mils (about 0.025 to about 0.41 mm). In a suitable range of thicknesses, a thicker adhesive layer may cause the stretch releasable tapes to be more easily removable than do thinner layers. This is in contrast to conventional methods of removal, such as removal by peeling at peel angles of 90 or higher, as described in U.S. Pat. No. 6,403,206 (Bries et al.), which is incorporated herein by reference.

The flexible adhesive tape strip 12 may vary in overall thickness so long as (i) it possesses sufficient integrity to be processable, and (ii) it provides the desired performance in respect to adhesion properties for adhering to and removable (e.g., via stretch releasing) from a mounting substrate surface of an electronic device.

Suitable stretch releasable adhesive strips include the one-side or double-sided stretch releasable adhesive strips available from 3M Company, St. Paul, Minn. under the COMMAND trade designation. Commercially available COMMAND adhesive strips are currently manufactured as discrete strips with one end of the strip including a non-adhesive pull tab to facilitate stretching of the strip during a stretch removal process.

Figure 4A:
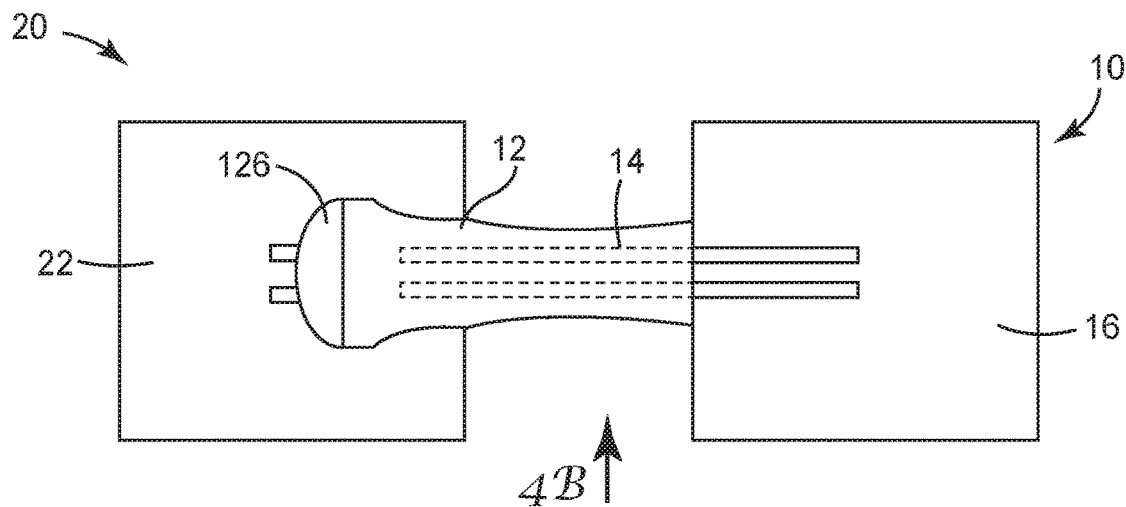
FIG. 4A is a top view of the electronic assembly of FIG. 3A where the flexible electrical connector and the electronic device are disengaged, according to one embodiment.
Figure 4B:
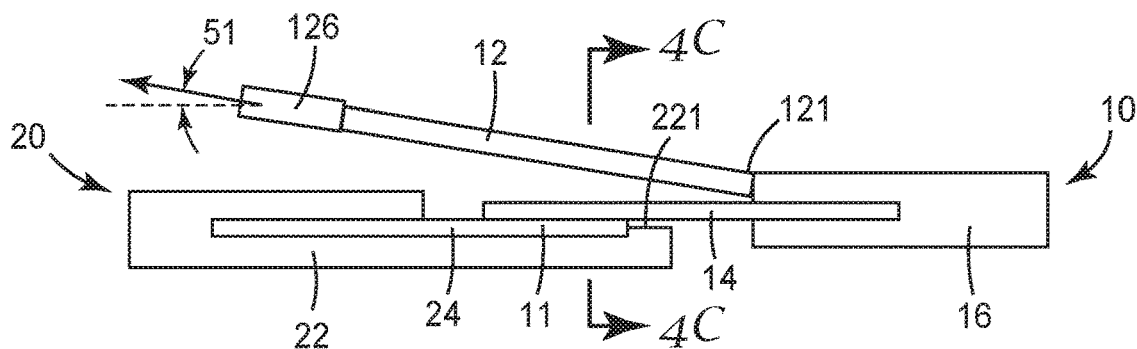
FIG. 4B is a side view of the electronic assembly of FIG. 4A.
Figure 4C:
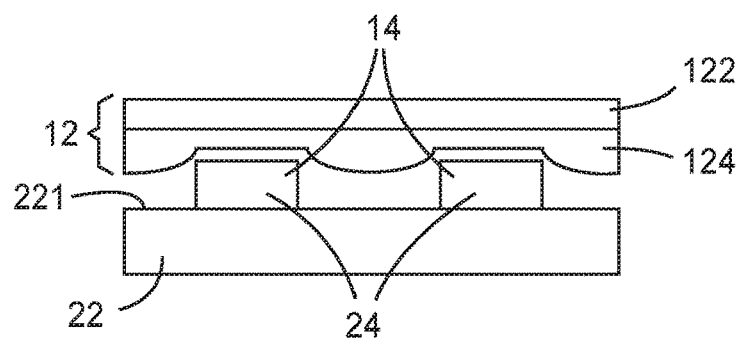
FIG. 4C is a cross-sectional view of the electronic assembly of FIG. 4B.

FIG. 4A is a top view of the electronic assembly 100 of FIG. 3A where the flexible electrical connector 10 and the electronic device 20 are disengaged, according to one embodiment. FIGS. 4B-C are a side view and a cross-sectional view of the electronic assembly 100 of FIG. 4A, respectively. In the depicted embodiment, the adhesive tape strip 12 is capable of being firmly bonded to the substrate surface 221 of electronic device 20 and thereafter being removable therefrom after being stretched at a stretching angle 51 with respect to the substrate surface 221. The non-adhesive pull tab 126 is provided at an end of the adhesive tape strip 12 to facilitate stretching of the strip 12 during a stretch removal process. It is to be understood that one or more non-adhesive pull tabs can be provided at various ends of the adhesive tape strip 12 to facilitate the stretching. For example, in some embodiments, a non-adhesive pull tab can be provided at the end 121 adjacent to the substrate 16 of the electrical connector 10.

In some embodiments, the adhesive tape strip 12 may be stretch releasable adhesive strip having a lengthwise elongation at break of, for example, from about 50% to about 1200%. The stretching angle 51 can be, for example, no greater than about 35°, no greater than about 20°, or no greater than about 10° from the substrate surface 221 without the strip rupturing prior to the removal of the tape from the substrate and without leaving substantial adhesive residue on the substrate surface. Removal at the appropriate angle can result in leaving no substantial or appreciable adhesive residue and in preventing the substrate surface from being damaged.

While not wanting to be bound to theory, it is believed that a stretch removal process in some embodiments described herein involves debonding of a highly elongated adhesive tape at low stretching angles as characterized by a "sharp" type of crack propagation. Such a stretch removal process may be different from a peeling removal process where an adhesive tape is removed from a substrate surface by peeling the tape at a peel angle of, for example, 35° or higher. The peeling removal process may leave residue of adhesive on the substrate surface or to cause damage to the substrate surface. Differences between typical stretch removal and peel removal processes were described in U.S. Pat. No. 6,403,206 (Bries et al.), which is incorporated herein by reference.

The operation of the present disclosure will be further described with regard to the following embodiments directed to removable electrical connectors and devices and methods of making and using the same. These embodiments are offered to further illustrate the various specific and preferred embodiments and techniques. It should be understood, however, that many variations and modifications may be made while remaining within the scope of the present disclosure.

Listing of Exemplary Embodiments

It is to be understood that any one of embodiments 1-10 and 11-18 can be combined.

Embodiment 1 is a method of removably connecting electronic devices, the method comprising:
providing a first electronic device comprising a first electrically conductive trace being at least partially disposed on an adhesive tape strip thereof, the first electrically conductive trace having a first exposed contact surface;
providing a second electronic device comprising a receiving electrically conductive trace disposed on a substrate thereof, the receiving electrically conductive trace having a receiving contact surface; and
engaging the first and second electronic devices such that the first exposed contact surface of the first electrically conductive trace and the receiving contact surface of the receiving electrically conductive trace at least partially contact with each other to form an electrical contact, and the adhesive tape strip having an adhesive surface removably adhesively bonded to the substrate of the second electronic device to at least partially cover the electrical contact.

Embodiment 2 is the method of embodiment 1, further comprising disengaging the first and second electronic devices by removing the adhesive tape strip from the second electronic device.

Embodiment 3 is the method of embodiment 2, wherein removing the adhesive tape strip from the second electronic device comprises stretch-releasing the adhesive tape strip via a shearing mechanism.

Embodiment 4 is the method of embodiment 3, wherein the stretch-releasing of the adhesive tape strip has a stretching angle no greater than about 35° from the substrate of the second electronic device.

Embodiment 5 is the method of any one of embodiments 2-4, wherein the second electronic device remains substantially intact after disengaging the first and second electronic devices.

Embodiment 6 is the method of any one of embodiments 1-5, wherein the first electronic device is a disposable electronic device.

Embodiment 7 is the method of any one of embodiments 1-6, wherein the second electronic device is a non-disposable electronic device.

Embodiment 8 is the method of any one of embodiments 1-7, wherein the adhesive tape strip is a stretch releasable tape including a pressure-sensitive adhesive.

Embodiment 9 is the method of embodiment 8, wherein the stretch releasable tape comprises a flexible backing layer having the pressure-sensitive adhesive on the adhesive surface thereof.

Embodiment 10 is the method of any one of embodiments 1-9, further comprising providing a non-adhesive pull tab at one end of the adhesive tape strip.

Embodiment 11 is a flexible electrical connector comprising:
a removable adhesive tape strip having an adhesive surface thereof and
one or more electrically conductive traces disposed on the adhesive tape strip,
wherein the adhesive tape strip extends between a first end and a second end thereof, the adhesive surface having an exposed portion adjacent to the first end, and the electrically conductive traces having an exposed contact surface adjacent to the first end configured to contact another exposed contact surface to form an electrical contact.

Embodiment 12 is the flexible electrical connector of embodiment 11, wherein the removable adhesive tape strip is a stretch releasing adhesive tape.

Embodiment 13 is the flexible electrical connector of embodiment 12, wherein the stretch releasable tape comprises a flexible backing layer having the pressure-sensitive adhesive on a major surface thereof.

Embodiment 14 is the flexible electrical connector of any one of embodiments 11-13, wherein the adhesive tape strip further includes a non-adhesive pull tab at the first end thereof.

Embodiment 15 is the flexible electrical connector of any one of embodiments 11-14, further comprising a substrate, wherein the adhesive tape strip has the second end attached to the substrate.

Embodiment 16 is the flexible electrical connector of any one of embodiments 11-15, further comprising an adhesive tape structure including one or more second electrically conductive traces electrically connected to the electrically conductive traces of the adhesive tape strip.

Embodiment 17 is an electronic device assembly comprising:
the removable electrical connector of any one of embodiments 11-16; and
a first electronic device comprising a receiving electrically conductive trace disposed on a substrate thereof, the receiving electrically conductive trace having a receiving contact surface,
wherein the exposed contact surface of the electrical connector and the receiving contact surface of the electrically conductive trace at least partially contact to each other to form an electrical contact, and the exposed portion of the adhesive surface is removably adhesively bonded to the substrate of the electronic device to at least partially cover the electrical contact.

Embodiment 18 is the electronic device assembly of embodiment 17, further comprising a second electronic device electrically connected to the second end of the removable electrical connector such that the first and second electronic devices are electrically connected.

Reference throughout this specification to "select embodiments", "certain embodiments", "some embodiments", or "an embodiment", whether or not including the term "exemplary" preceding the term "embodiment", means that a particular feature, structure, material, or characteristic described in connection with the embodiment is included in at least one embodiment of the certain exemplary embodiments of the present disclosure. Thus, the appearances of these phrases in various places throughout this specification are not necessarily referring to the same embodiment of the certain exemplary embodiments of the present disclosure. Furthermore, the particular features, structures, materials, or characteristics may be combined in any suitable manner in one or more embodiments.

The operation of the present disclosure will be further described with regard to the following detailed examples. These examples are offered to further illustrate the various specific and preferred embodiments and techniques. It should be understood, however, that many variations and modifications may be made while remaining within the scope of the present disclosure.

EXAMPLES

These Examples are merely for illustrative purposes and are not meant to be overly limiting on the scope of the appended claims. Notwithstanding that the numerical ranges and parameters setting forth the broad scope of the present disclosure are approximations, the numerical values set forth in the specific examples are reported as precisely as possible. Any numerical value, however, inherently contains certain errors necessarily resulting from the standard deviation found in their respective testing measurements. At the very least, and not as an attempt to limit the application of the doctrine of equivalents to the scope of the claims, each numerical parameter should at least be construed in light of the number of reported significant digits and by applying ordinary rounding techniques.

Examples and Comparative Examples

Flexible electrical connectors were prepared by attaching electrically conductive traces (i.e., copper foil) onto various adhesive surfaces. A PET substrate with electrically conductive traces (Ag or Cu) was prepared. The traces on the connectors and the PET substrate were aligned, and then the adhesive surfaces were pressed, via a roller, against the PET substrate to cover the electrical contact formed by the respective traces. The electrical connectors and the PET substrate were then separated via peeling or stretch releasing after sitting for 1 day. Materials for making examples are summarized in Table 1 below. The configurations of examples and their respective measured properties are listed in Table 2 below.

Summary of Materials

Table 1 provides abbreviations and a source for all materials used in the Examples below:

| Abbreviation | Description | Source |
| --- | --- | --- |
| Clear Command | Transparent, flexible and stretchable polymer backing with adhesive available under the trade designation Command Clear Strips | 3M Company, St. Paul., MN |
| VHB | Adhesive transfer tapes available under the trade designations Scotch VHB F-946OPC and F-9469PC | 3M Company, St. Paul., MN |
| Foam Command | Foam backing with adhesive available under the trade designation Command Strips | 3M Company, St. Paul., MN |
| Scotch Tape | Cellulose acetate backing with acrylate adhesive available under the trade designation Scotch Magic Tape | 3M Company, St. Paul., MN |
| Post-it Note | Paper backing with adhesive available under the trade designation Post-it Notes | 3M Company, St. Paul., MN |

TABLE 2

| | Electrical Connector Construction | Does it hold the traces together when flexed? | Resistance after 1 hour | Resistance after 1 day | Does it damage the traces when separated via peeling? | Does it damage the traces when separated via stretch releasing? |
| --- | --- | --- | --- | --- | --- | --- |
| Example 1 | Clear command | Yes | 0.1 ohm | 0.1 ohm | Yes | No |
| Example 2 | VHB | Yes | 0.1 ohm | 0.1 ohm | Yes | No |
| Example 3 | Foam Command | Yes | 0.1 ohm | 0.1 ohm | Yes | No |
| Comparative Example 1 | Scotch Tape | Yes | 0.1 ohm | 0.1 ohm | Yes | Not stretch releasable. |
| Comparative Example 2 | Post-it Note | No | 0.1 ohm | 1 ohm | No | Not stretch releasable. |

Examples 1-3 can hold the traces together upon flex. Also, a stretch releasing process did not damage the traces on the PET substrate. Comparative Examples 1-2 are not stretch releasable. Removal by peeling created some damage in most cases. The only case where peeling did not create any noticeable harm to the traces is Comparative Example 2, where the adhesive of a Post-it note is very weak. Such weak adhesives failed to provide a robust electrical contact between the two substrates, which is easily disrupted upon flexing, or the electrical intimacy between the traces is reduced over time by adhesive relaxations.

While the specification has described in detail certain exemplary embodiments, it will be appreciated that those skilled in the art, upon attaining an understanding of the foregoing, may readily conceive of alterations to, variations of, and equivalents to these embodiments. Accordingly, it should be understood that this disclosure is not to be unduly limited to the illustrative embodiments set forth hereinabove.

Furthermore, all publications and patents referenced herein are incorporated by reference in their entirety to the same extent as if each individual publication or patent was specifically and individually indicated to be incorporated by reference. Various exemplary embodiments have been described. These and other embodiments are within the scope of the following claims.

What is claimed is:

1. A method comprising:
    positioning a first electronic device adjacent to a second electronic device, wherein the first electronic device comprising a first electrically conductive trace being at least partially disposed on an adhesive tape strip thereof, the first electrically conductive trace having a first exposed contact surface,
    and the second electronic device comprising a receiving electrically conductive trace disposed on a substrate thereof, the receiving electrically conductive trace having a receiving contact surface; and
    engaging the first and second electronic devices such that the first exposed contact surface of the first electrically conductive trace and the receiving contact surface of the receiving electrically conductive trace at least partially contact with each other to form an electrical contact, and the adhesive tape strip having an adhesive surface removably adhesively bonded to the substrate of the second electronic device to at least partially cover the electrical contact.

2. The method of claim 1, wherein the first electronic device is a disposable electronic device.

3. The method of claim 1, wherein the second electronic device is a non-disposable electronic device.

4. The method of claim 1, further comprising providing a non-adhesive pull tab at one end of the adhesive tape strip.

5. The method of claim 1, wherein the adhesive tape strip is a stretch releasable tape including a pressure-sensitive adhesive.

6. The method of claim 5, wherein the stretch releasable tape comprises a flexible backing layer having the pressure-sensitive adhesive on the adhesive surface thereof.

7. The method of claim 1, further comprising disengaging the first and second electronic devices by removing the adhesive tape strip from the second electronic device.

8. The method of claim 7, wherein the second electronic device remains substantially intact after disengaging the first and second electronic devices.

9. The method of claim 7, wherein removing the adhesive tape strip from the second electronic device comprises stretch-releasing the adhesive tape strip via a shearing mechanism.

10. The method of claim 9, wherein the stretch-releasing of the adhesive tape strip has a stretching angle no greater than about 35° from the substrate of the second electronic device.

11. A flexible electrical connector comprising:
    a removable adhesive tape strip having an adhesive surface thereof; and
    one or more electrically conductive traces disposed on the adhesive tape strip,
    wherein the adhesive tape strip extends between a first end and a second end thereof, the adhesive surface having an exposed portion adjacent to the first end, and the electrically conductive traces having an exposed contact surface adjacent to the first end configured to contact another exposed contact surface to form an electrical contact.

12. The flexible electrical connector of claim 11, wherein the adhesive tape strip further includes a non-adhesive pull tab at the first end thereof.

13. The flexible electrical connector of claim 11, further comprising a substrate, wherein the adhesive tape strip has the second end attached to the substrate.

14. The flexible electrical connector of claim 11, further comprising an adhesive tape structure including one or more second electrically conductive traces electrically connected to the electrically conductive traces of the adhesive tape strip.

15. The flexible electrical connector of claim 11, wherein the removable adhesive tape strip is a stretch releasing adhesive tape.

16. The flexible electrical connector of claim 15, wherein the stretch releasable tape comprises a flexible backing layer having the pressure-sensitive adhesive on a major surface thereof.

17. An electronic device assembly comprising a removable electrical connector; and
    a first electronic device comprising a receiving electrically conductive trace disposed on a substrate thereof, the receiving electrically conductive trace having a receiving contact surface,
    wherein the exposed contact surface of the electrical connector and the receiving contact surface of the electrically conductive trace at least partially contact to each other to form an electrical contact, and the exposed portion of the adhesive surface is removably adhesively bonded to the substrate of the electronic device to at least partially cover the electrical contact;
    Wherein the removable electrical connector is a flexible electrical connector; the connector comprising a removable adhesive tape strip having an adhesive surface thereof; and
    one or more electrically conductive traces disposed on the adhesive tape strip, wherein the adhesive tape strip extends between a first end and a second end thereof, the adhesive surface having an exposed portion adjacent to the first end, and the electrically conductive traces having an exposed contact surface adjacent to the first end configured to contact another exposed contact surface to form an electrical contact.

18. The electronic device assembly of claim 17, further comprising a second electronic device electrically connected to the second end of the removable electrical connector such that the first and second electronic devices are electrically connected.

* * * * *